(12) United States Patent
Edmonston

(10) Patent No.: US 8,433,986 B2
(45) Date of Patent: Apr. 30, 2013

(54) METHOD AND APPARATUS FOR LOW LATENCY TURBO CODE ENCODING

(75) Inventor: Brian S. Edmonston, San Diego, CA (US)

(73) Assignee: iCODING Technology Inc, San Diego, CA (US)

( * ) Notice: Subject to any disclaimer, the term of this patent is extended or adjusted under 35 U.S.C. 154(b) by 1194 days.

(21) Appl. No.: 12/136,930

(22) Filed: Jun. 11, 2008

(65) Prior Publication Data

US 2009/0313522 A1    Dec. 17, 2009

(51) Int. Cl.
*H03M 13/03*    (2006.01)

(52) U.S. Cl.
USPC .......................................................... 714/786

(58) Field of Classification Search .................. 714/752, 714/755, 786
See application file for complete search history.

(56) References Cited

PUBLICATIONS

European Standards, ETSI EN 301 790 V1.41, Sep. 2005, Eurpoean Broadcasting Union, p. 1 to 117.*

* cited by examiner

*Primary Examiner* — Shelly A Chase
(74) *Attorney, Agent, or Firm* — Brian S. Edmonston

(57) ABSTRACT

A method and apparatus for performing low latency Turbo Code encoding of a frame of data is described. The disclosure includes a method for performing Turbo Code encoding on frame of data using by encoding via subsections using multiple constituent encoders in parallel. The information gains during a first encoding pass of the subsections is used to determine the start state for a second pass during which parity bits are generated. Both the interleaved and natural order encoding may be performed in parallel.

10 Claims, 5 Drawing Sheets

METHOD AND APPARATUS FOR LOW LATENCY TURBO CODE ENCODING

BACKGROUND OF THE INVENTION

1.0 Field of the Invention

The following invention is related to the area of digital communications. More particularly, the following invention is related to a method and apparatus for performing low latency Turbo Code encoding of a frame of data.

2.0 Background of the Invention

Turbo Codes are a form of error correction that typically use recursive systematic convolutional ("RSC") codes. The RSC codes (also referred as constituent codes in the context of turbo codes) are used to encode a block of data in natural order and interleaved order. The resulting parity bits generated by these encodings are transmitted with the original frame of data, often referred to as the systematic data. Other variations of Turbo Codes are well known including codes that use more than two RSC encodings, codes that only encode portions of the entire frame of data and non systematic constituent codes.

During the encoding process the RSC encoders receive the systematic data "symbols" (typically a bit of data, but may be multiple bits as well). As each new data symbol is received the "state" of the encoder is updated and the state of the encoder changes. The parity symbols are generated based on the state of the encoder and the input data. These encoders arg referred to as "recursive" because the state of the encoder is fed back to the input of the encoder making the current state of the encoder dependant on all the previous systematic data that had been received since the coding was initiated.

The initial and termination states of the RSC encoders affect the encoding operation. In some cases zero termination is used where the encoders start and end at the zero state. In other cases tail biting is used during the encoding process.

Tail biting involves passing the data to be encoded through the encoder a first time in order to determine a new start state for the encoder. Once this new start state is determined the data is encoded a second time. If done correctly, the start and the end state are the same which eliminates the need to transmit the information associated with the termination.

Tail biting reduces the total number of parity bits that must be transmitted because any parity bits associated with termination to a known state (typically zero) of the encoder may be omitted. However, tail biting increases the complexity and delay associated with the encoding process as twice the number of encoding steps must be performed.

In general, encoding is a simple process and may be performed quickly using a highly clocked encoding circuit. However, in some instances it may be desirable to perform very high speed encoding in order to limit end-to-end transmission latency, which can be considerable in an iterative decoding scheme such as turbo codes. In other cases it will not be possible to clock the conventional Turbo Code encoder circuit at a sufficient rate to achieve the desired throughput. Because of the recursive nature of RSC codes used in Turbo Codes it is difficult to encode in parts. Thus, there is a need for a highly efficient method and apparatus for performing low latency Turbo Code encoding.

SUMMARY OF THE INVENTION

A method and apparatus for performing low latency Turbo Code encoding of a frame of data has been described. In accordance with one embodiment of the invention a method for performing Turbo Code encoding on frame of data includes the steps of encoding a first segment of the frame and recording a segment state delta based on a start state and an end state created thereby, determining an actual end state based on the segment state delta and a new start state and encoding the segment using the new start state.

In an alternative embodiment of the invention an apparatus for Turbo code encoding a frame of data includes a memory circuit for storing the frame of data and for reading segments of the frame out in parallel, a plurality of encoder circuits for receiving a set of segments of the frame and for calculation of a set of state deltas based on a set of start state and a set of end state based on the encoding of the set of segment, and a new state table for calculating a set of new end states based on the set of state deltas and a set of new start states, wherein the plurality of encoders a further for generating parity bits in parallel based on the set of new start states.

In still another embodiment of the invention a method for Turbo Code encoding a frame of data includes the steps of encoding the first subsection and the second subsection substantially in parallel, recording a first end state for the first subsection, recording a delta value for the second subsection, predicting a true final state for the second subsection using the delta value and the first end state.

In still another embodiment of the invention, a Turbo Code encoder for encoding a data frame includes a first constituent encoder, a second constituent encoder, a state change table, a memory for storing the data frame and reading multiple data values out in parallel, wherein the first constituent encoder generates a final state by encoding a first natural order subsection of the data frame, the second constituent encoder generates a delta value by encoding a second natural order subsection of the data frame and the state change table generates a new final state for the second natural order subsection based on the delta value and the final state.

In still another embodiment of the invention, a Turbo Code encoder circuit includes a state change prediction circuit for generating a new end state in response to a state change value and a new start state, a first constituent encoder for generating a final state by encoding a first subsection of the data frame, second constituent encoder for generating a state change value by encoding a second subsection of the data frame, wherein the new start state is set to the final state.

In still another embodiment of the invention a method for Turbo Code encoding a frame of data includes the steps of encoding a set of subsections of the frames to generate a set of delta values and a set of final states, calculating a set of new start states based on the set of delta values and set of final states and reencoding at least a portion of the set of subsections using the set of new start states.

In still another embodiment of the invention, a method for Turbo Code encoding a frame of data includes the steps of encoding a set of subsections of the frames to generate a set of delta values and a set of final states, calculating a set of new start states based on the set of delta values and set of final states reencoding at least a portion of the set of subsections using the set of new start states.

In still another embodiment of the invention a Turbo Code encoder for encoding a frame of data includes plurality of constituent encoders for receiving subsections of the data frame and generating delta values and first final states, a state change table for calculating new final states based on the delta values and the first final states, wherein the plurality of constituent encoder are further for receiving the subsection of the data frame a second time and using the new final states as start states encoding the subsections and generating parity bits.

In still another embodiment of the invention a method for Turbo code encoding a data frame, the data frame having a subsection 0, a subsection 1 and a subsection 2 which are adjacent to one another, includes the steps of a) encoding the subsection 0 using a first start state and recording a first end state, b) encoding the subsection 1 using a second state and recording a second end state, c) encoding the subsection 1 using a second state and recording a second end state, calculating a first new end state for the subsection 1 using the first end state and the second end state, encoding subsection 2 using the first new end state as a new start state and generating parity bits thereby, wherein steps a), b) and c) are performed substantially in parallel.

In still another embodiment of the invention a circuit for performing Turbo Code encoding of a data frame, the data frame having a subsection, includes an encoder for performing a first encoding on the subsection and generating a data dependant value based on the data contained in the subsection and a state change circuit for predicting a new end state for the subsection based on a new start state and the data dependant value.

DETAILED DESCRIPTION OF THE EMBODIMENTS

A method and apparatus for performing low latency Turbo Code encoding of a frame of data is described. The invention is set forth in the context of one or more exemplary embodiments. Those skilled in the art will recognize various additional alternative embodiments of the invention. Additionally, the invention is set forth in using various block diagrams and other representational figures. These block diagrams may represent, for example, integrated circuits, method steps, software executed on a microprocessor, or any combination thereof. Additionally, any control functions performed herein may be done using the various techniques well know in the art including state machine based control systems or software running on a microprocessor (or even human based control).

Figure 1:
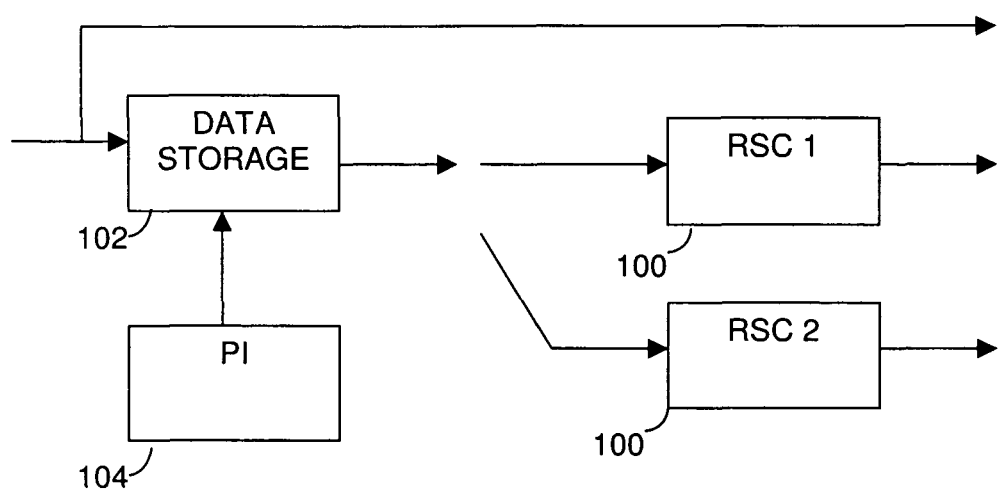
FIG. 1 is a block diagram of an exemplary Turbo Code encoder.

FIG. 1 is a block diagram of an exemplary Turbo Code encoder. Data storage 102 contains the data frame to be encoded and the pseudo-random interleaver (PI) 104 can be used to read the data out in natural or interleaved order. The data frame may be processed in bits or sets of bits (including di-bits as used in duo-binary turbo code also referred to as quaternary turbo codes) and throughput the application the use of the term "bit" or "bits" to describe the data frame may also refer to sets of bits unless specified otherwise.

One of recursive systematic convolution encoders 100 receives the data in natural order and the other receives the data frame in interleaved order. The encoders may be separate hardware or may be the same hardware used in time shared fashion. Each generates parity symbols that are then forwarded along with the original data frame (the systematic information) for further processing and ultimately transmission.

The termination of a Turbo Code is typically performed in one of two ways, both of which are well known in the art. The first is zero trellis termination in which zeros are entered into the state memories at the start and the end of the encoding process by each RSC 100. With zero trellis termination RSC's 100 each perform encoding on the data frame only once in order to generate the parity symbols.

The second method of termination is referred to as tail biting. With tail biting each RSC encoder makes two passes of the data frame to perform the encoding. During the first pass, the RSC encoder determine the final condition ("end state" or "final state") of the state memories in the RSC after processing the entire frame using a start state of zero. This end state is then used to determine a new start state that will be used during a second encoding of the data frame.

The new start state is selected so that the end state in the second encoding will be the same is the new start state. By configuring the RSC encoders to have the state memories in same start and end state during the second encoding there is no need to transmit the additional data and parity bits associated with the termination bits used in the prior method. Thus, the amount of overhead is reduced at the expense of a more complicated encoding process.

In Turbo Codes when multi-bit symbols are used, such as duo-binary codes, the interleaved encoding typically involved the swapping of the order of the symbols. For example, a symbol consisting of bit pairs (A, B) will be encoded as ((A, B), (B, A), (A,B), (B,A)). This technique is widely known in the art. Throughout this application it is assumed that bit swapping is performed for duo-binary codes unless specified otherwise. Such detail is not expressly described as it does not materially affect the various implementations and will only serve to obscure discloser of the various embodiments of the invention provided herein.

Figure 2A:
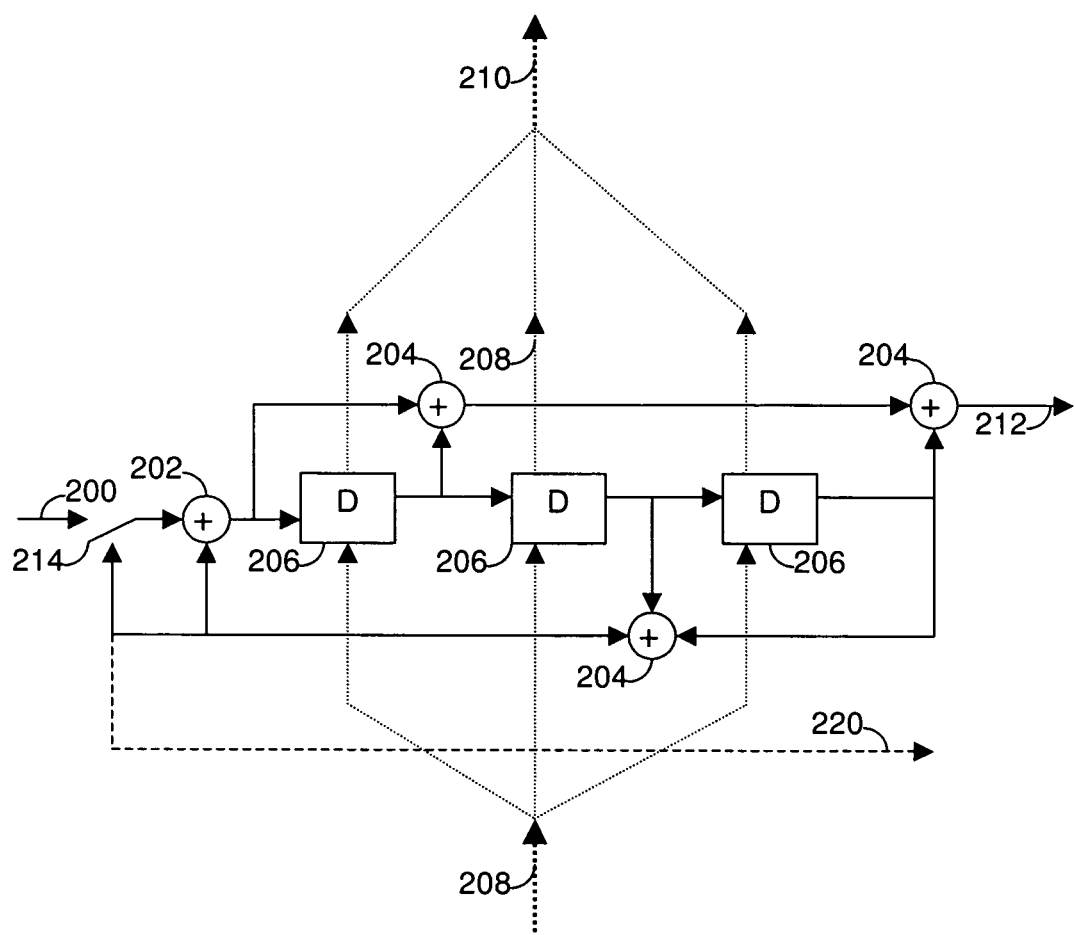
FIG. 2A is a diagram of a recursive systematic convolutional encoder configured in a manner consistent with some embodiments of the invention.

FIG. 2A is a diagram of a recursive systematic convolutional encoder configured in a manner consistent with some embodiments of the invention. The data to be encoded is received at node 100 and passed to exclusive-or (XOR) gate 202. As is well known in the art, the encoded data is shifted through the set of D flip-flops (D) 206 (or registers) causing the set of additional XOR gates 204 to generate parity bits 212.

When the encoder is used with zero termination of the trellis the state of the encoder is set to zero when encoding begins and once the data frame has been processed, switch 214 is set to the feedback position to shift in zeros in to the D flip-flops 206. Additionally, in some Turbo Code implementations the feedback termination bits are also transmitted via line 220.

Additionally, in an exemplary embodiment the state of the RSC encoder can be read using read-lines 210. Similarly, the state can be set using write-lines 208. Thus, during an encoding operation the initial state may be set before encoding begins and the ending state may be read-out.

The RSC encoder shown is provided for purposes of example and the use of other RSC encoders is consistent with other embodiments of the invention.

Figure 2B:
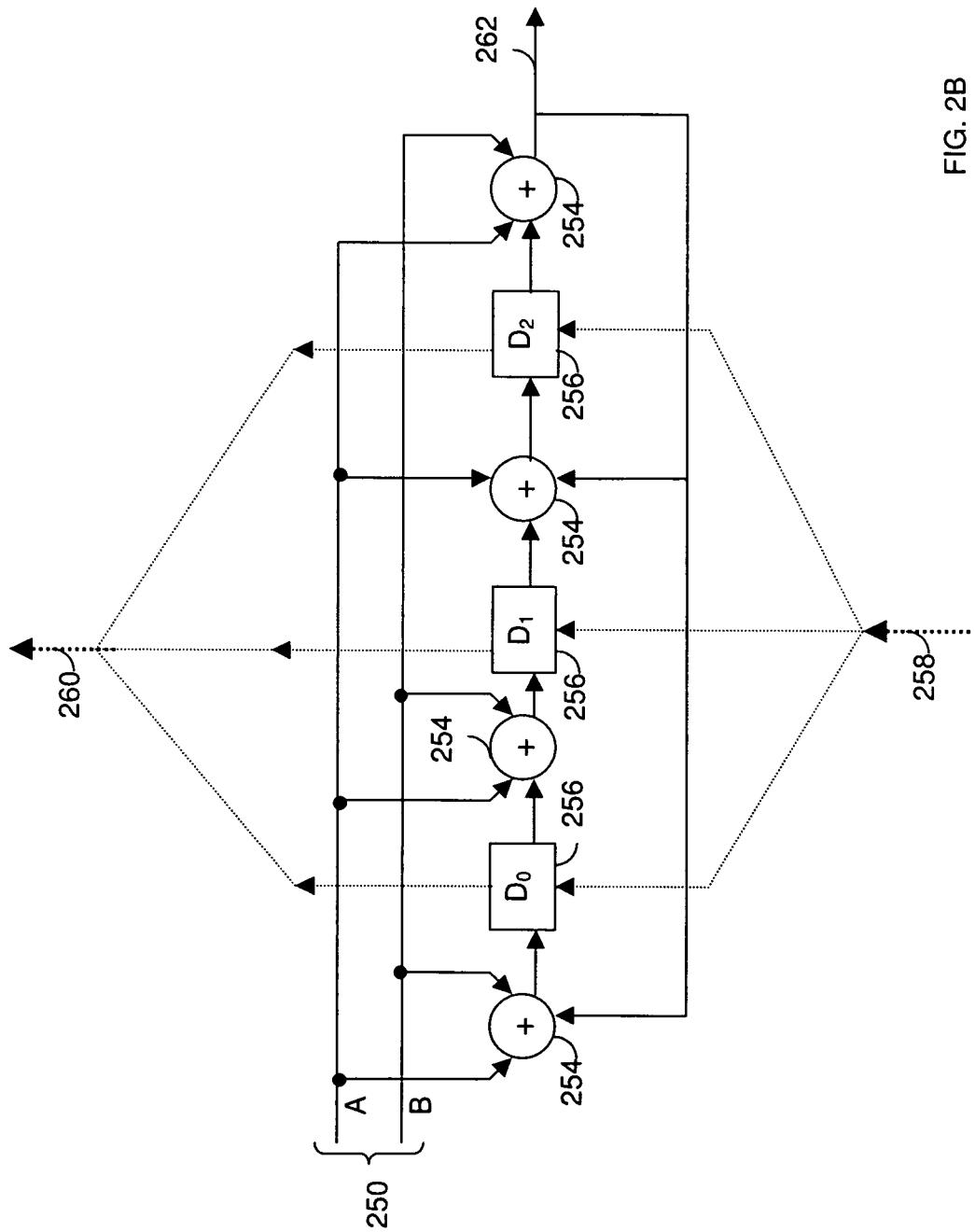
FIG. 2B is a diagram of a recursive systematic convolutional encoder configured in a manner consistent with some embodiments of the invention.

FIG. 2B is a diagram of a recursive systematic convolutional encoder configured in a manner consistent with some embodiments of the invention. The RSC encoder shown in FIG. 2B may be referred to as a "duo-binary" encoder. A duo-binary code processes code symbols in bit pairs. That is, the duo-binary encoder receives the information bits in pairs and generates a parity symbol in response. In the embodiment shown in FIG. 2B, a single parity bit is generated for each bit pair for an effective code rate of ⅔. Those skilled in the art will recognize that additional parity bits may be generated to support lower code rates.

Another example of a duo-binary encoder is described in the Turbo Code section of the ETSI standard "Interaction channel for satellite distribution systems" (ETSI EN 301 790) incorporated herein by reference. The ETSI standard is often referred to as DVB-RCS.

During operation, bit pairs 250 (A, B) are received and applied to the encoder circuit. In particular, bits A and B are applied to three different exclusive-or (XOR) gates 254. Additionally, bit A is applied to a fourth XOR gate 25499.

The various signals stored by registers 256 ($D_0$-$D_2$) are also routed as shown, including feedback to other latches.

As the bit pairs 250 are received and the various signals clocked in by registers 256. With each new bit pair a new parity bit 262 is generated and the states of the registers 256 are updated.

The state of the encoder, as defined by registers 256, may be set by lines 258 and may be read using lines 260. The set lines 258 are typically used to set the init state of the encoder before encoding begins and lines 260 may be used to read out the state to determine the delta zero state which is described in greater detail below. During typical operation the state of the registers 256 are first set to all zero and the frame or subsection is encoded. The resulting state is read out using lines 260 and used to calculate a new init state (or states) as described in greater detail below. The new init states are then introduced into the encoder using set lines 258.

Figure 3:
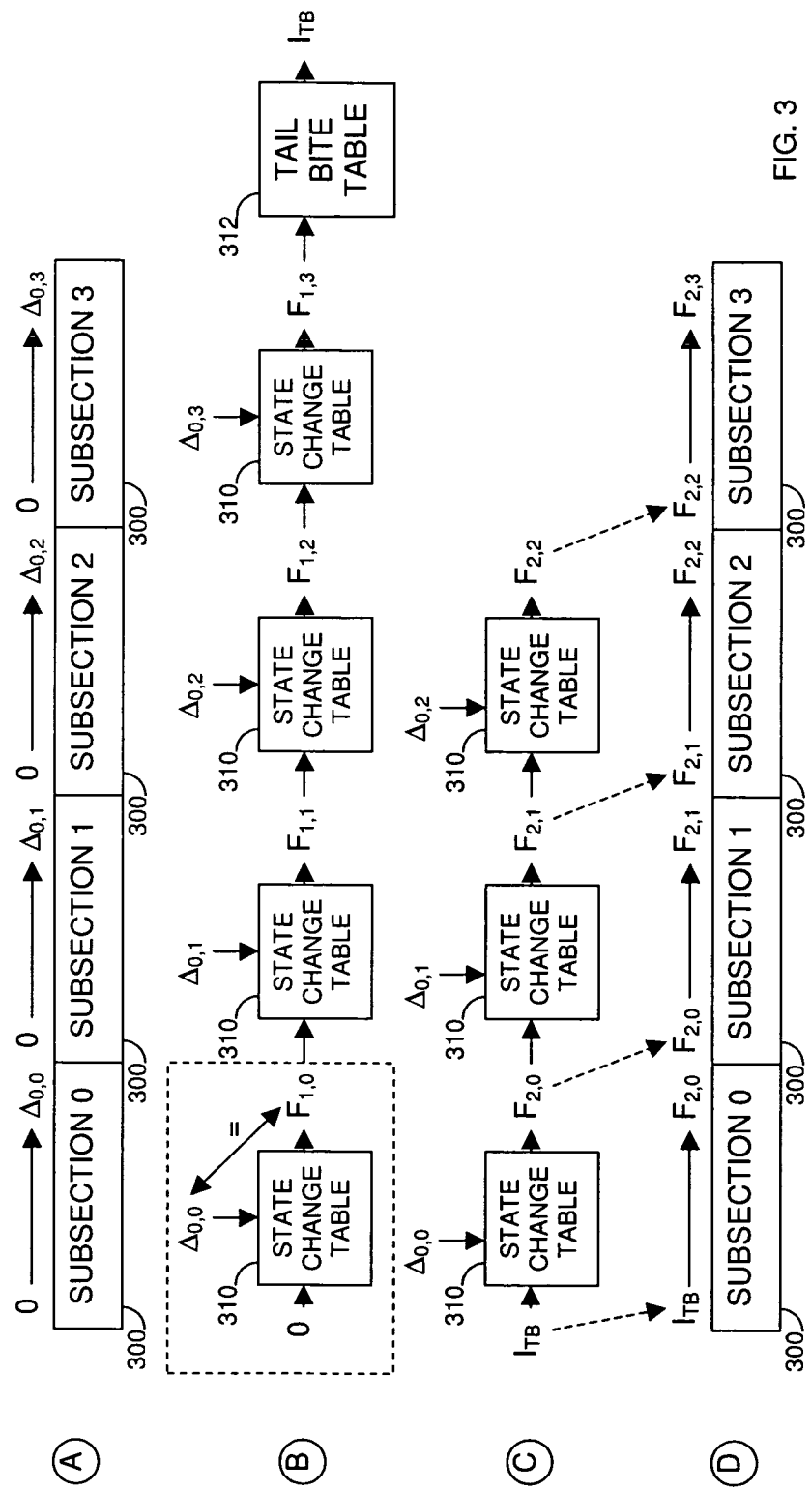
FIG. 3 is a diagram illustrating the steps performed during encoding in accordance with an exemplary embodiment of the invention.

FIG. 3 is a diagram illustrating the steps performed during encoding in accordance with an exemplary embodiment of the invention. Row A represents a data frame divided into four subsections 300 (also referred to as segments). Each subsection contains a sequential portion of the data associated with the entire data frame. Preferably, the four subsections would be of equal length, but different subsection lengths could be used. Additionally, more or fewer subsections could be used depending on the level of parallelism desired.

During exemplary processing each subsection is encoded separately. Preferably this is done in parallel using separate encoders so that fewer clock cycles are needed to perform the encoding. Each subsection is preferably the next section in sequence of the data frame relative to the prior subsection.

In the exemplary embodiment the encodings are performed by first initializing the state of each encoder to zero (although other known init states may be used). The subsections are then encoded and the state of the encoders at the end of the processing the subsections is stored.

This ("first") final state is referred to as the delta zero value ($\Delta_0$) of that subsection, as it is the change ("delta") from state 0 incurred by the encoder during the processing of that subsection. The delta zero value is dependent on the data in the subsection. That is, different data will yield a different delta zero value. Once the delta zero value is calculated, however, the state change that would occur using the same data but a different starting state can be predicted in a deterministic manner (The "new" final state). This property is used to perform look-ahead state initialization of the various segments in order to facilitate parallel encoding of the frame as described below.

The delta could also be calculated relative to other start states in other embodiments of the invention. However, there is at least one advantage to using the delta state relative to zero because the normal encoding of the data frame uses zero initialized encoders during calculation of the tail bite init state. This allows a look-ahead operation to be eliminated for the first subsection as described below.

Once the $\Delta_0$ for each subsection is determined ($\Delta_{0,0}$, $\Delta_{0,1}$, $\Delta_{0,2}$, $\Delta_{0,3}$), the processing shown in row B is performed. In the exemplary embodiment the processing shown in row B is performed to determine the tail biting termination that will be applied during the actual encoding of the data frame.

In the exemplary embodiment, the tail bite termination is determined by predicting the end state of a first subsection using a look-ahead table and then applying that predicted end state as the input of the next subsection. This process continues until the end state of the final subsection is predicted, which corresponds to end state of the entire frame.

For the first subsection the calculation of the final state for that subsection is trivial. It is trivial because the final state for the first subsection is equal to the $\Delta_0$ for the first subsection because the encoder was initialized to the zero state during the tail bite calculation process. Thus, there is no need to modify the initialization state for the encoding of this subsection. The figure shows the final state for subsection 0 ($F_{1,0}$) calculated using the $\Delta_{0,0}$ and a 0 value for the previous state, however, this is primarily done for purposes of illustration as in a typical embodiment the $\Delta_{0,0}$ would just be used directly eliminating the need to perform a table look-up.

The final state for subsection 1 ($F_{1,1}$) is then calculated by applying the final state of the previous subsection ($F_{1,0}$) and the delta zero value for the current subsection calculated during step A ($\Delta_{0,1}$). These two values are applied to the state change table to calculate the final subsection state ($F_{1,1}$).

In addition to the two values described above, the state change table will receive the mod seven (mod-7) factor of the subsection length. This is the case for all the state change tables described herein. The mod-7 factor is used because the period of the RSC encoder is seven (both FIGS. 2A and 2B). For other constituent encoders, such as sixteen (16) state encoders (using four registers) with a period of 15, the mod factor will be different.

The mod-7 factor is used to select the particular set of entries on which to perform the look-ahead operation as described in greater detail below. In general, the mod-7 factor will not change for processing a frame of a particular size, so the mod-7 input to the state change table is not shown for ease of drawing and to avoid unnecessarily complicating the figures.

Additionally, for a Turbo Code encoder that is only expected to encode one frame length, or a limited number of frames, the table entries for the mod-7 values of those frame lengths (and in particular the subsections thereof) supported by the encoder only need to be stored in the state change tables.

The process continues with the calculation of the final state for subsection 2 ($F_{1,2}$) using the final state of the previous subsection 1 ($F_{1,1}$) and the delta value for subsection 2 calculated during step A ($\Delta_{0,2}$). These two values are applied to the state change table to calculate the final subsection state ($F_{1,2}$).

The final state of subsection 3 ($F_{1,3}$) is then calculated using the final state of the previous subsection 2 ($F_{1,2}$) and the delta value for subsection 3 calculated during step A ($\Delta_{0,3}$). These two values are applied to the state change table to calculate the final subsection state ($F_{1,3}$), which is the final state for the entire data frame when coding is performed with an init state of zero.

Once the final state has been calculated the new init state ($I_{TB}$) is calculated by applying the final state to tail bite table 312.

In an exemplary embodiment using a duo-binary RSC encoder like that of FIG. 2B the tail bite termination state is calculated using a table like that shown in Table 1 below.

TABLE 1

Tail Bite Termination Initialization State Look Up Table

| $S_{N-1,0}$ N mod 7 | 0 | 1 | 2 | 3 | 4 | 5 | 6 | 7 |
|---|---|---|---|---|---|---|---|---|
| 1 | $S_c = 0$ | $S_c = 7$ | $S_c = 5$ | $S_c = 2$ | $S_c = 1$ | $S_c = 6$ | $S_c = 4$ | $S_c = 3$ |
| 2 | $S_c = 0$ | $S_c = 3$ | $S_c = 6$ | $S_c = 5$ | $S_c = 7$ | $S_c = 4$ | $S_c = 1$ | $S_c = 2$ |
| 3 | $S_c = 0$ | $S_c = 4$ | $S_c = 3$ | $S_c = 7$ | $S_c = 6$ | $S_c = 2$ | $S_c = 5$ | $S_c = 1$ |
| 4 | $S_c = 0$ | $S_c = 5$ | $S_c = 1$ | $S_c = 4$ | $S_c = 2$ | $S_c = 7$ | $S_c = 3$ | $S_c = 6$ |
| 5 | $S_c = 0$ | $S_c = 2$ | $S_c = 4$ | $S_c = 6$ | $S_c = 3$ | $S_c = 1$ | $S_c = 7$ | $S_c = 5$ |
| 6 | $S_c = 0$ | $S_c = 6$ | $S_c = 7$ | $S_c = 1$ | $S_c = 5$ | $S_c = 3$ | $S_c = 2$ | $S_c = 4$ |

Table 1 is provided for convenience as those skilled in the art should be able to determine the proper tail bite initialization state for a given RSC encoder via calculation or search.

The rows are the modulo 7 factor of the frame length, N (in bit pairs), being encoded and the columns are the final state of the encoder when initialized in the all zero state ($S_{N-1,0}$). The entry is the new initialization state that should be used for the actual encoding during which parity bits are generated.

The lookups performed in row B using state change tables 310 typically require a single clock cycle. Thus, to calculate the final state typically requires only three clock cycles (don't need to perform lookup on the first subsection) once the $\Delta_0$ value is calculated for each subsection. Once the final state is calculated the tail bite termination initialization state can be calculated by applying that final state to a tail bite table 312 containing the contents of Table I (for example). The result of this look-up operation is init value $I_{TB}$.

Typically, the look-up for final state value for each subsection 300 must be done in sequence. That is, you must calculate the end state for the previous section before you can calculate the enc state for the next section.

Thus, the set of state change tables 310 may be implemented as a single state change table 310 used sequentially in time, although multiple state change tables could be employed. The state change table 310 is typically simply look-up table which can be a memory storage circuit such as a SRAM or ROM although those skilled in the art will recognize that algebraic implementations of the state change table may be used. An exemplary set of contents for the state change table is provided below.

Since a subsection is only one fourth (¼) the entire frame in the exemplary embodiment, the calculation of the final state requires slightly more than ¼ (25%) the number of clock cycles to calculate. In particular, it requires 25% plus the three additional clocks to perform the lookups using the state change tables. For a data frame of any normal size (typically in the 100s or 1000s of bits or bit pairs) the overall saving in the number of clocks required to calculate the final state of the frame will be a little bit less than 75%, which is substantial. The clock savings can be increased at the expense of additional encoder circuits and therefore hardware, or could be reduced by using fewer encoders. For each segment an overhead state change table look-up is typically required.

The encoding process of the exemplary embodiment continues at row (C), where a new set of init states are calculated for each subsection. The new set of init states are used to start the second encoding of each subsection in parallel. During this second encoding the actual parity symbols are generated.

The init state used in row (C) for the processing of the first subsection is the init state for the entire frame $I_{TB}$. The init state $I_{TB}$ is also applied to the state change table 310 along with the delta zero value ($\Delta_{0,0}$) to calculate the predicted final state of subsection 0 ($F_{2,0}$). This final state is the initial state of the next subsection (subsection 1) and therefore it is used to initialize the encoder for the processing of subsection 1 shown in row D.

The final state of subsection 0 ($F_{2,0}$) is also applied to the next state change table 310 in conjunction with the delta value for section 1 ($\Delta_{0,1}$) to calculate the final state for section 1 ($F_{2,1}$). Final state ($F_{2,1}$) is used to initialize the encoder for the encoding of subsection 2 as well as to calculate the final state for subsection 2. In particular, the final state of subsection 1 ($F_{2,1}$) is applied in conjunction with the delta 0 value for subsection 2 ($\Delta_{0,2}$) to generate the final state of subsection 2 ($F_{2,2}$). The final state of subsection 2 ($F_{2,2}$) is then used to initialize the encoder for processing of subsection 3.

Referring now to row D, each subsection (0, 1, 2, 3) is initialized with the values generated during the processing of row C and then the encoding of each subsection is performed preferably in parallel or substantially in parallel. All the init states could first be generated and then the processing of the subsections initiated simultaneously. This is preferred in many instances as it allows a single memory circuit to be used to read out the data. Alternatively, the processing of each subsection could be offset slightly as the initialization data becomes available. The state change stables 310 may be separate entities, but are preferably a single time shared entity so as to reduce resource usage.

Again, by breaking the frame up into subsections that are processed in parallel the time required to encode a frame is reduced to almost 25% of the time required for a single encoder circuit using the same clock. Only an additional three clock cycles are required to perform the look-up operations necessary to calculation the init states for encoding subsections 1 through 3.

This decreased encoding time reduces latency and allows for higher throughput using lower clock speeds. Thus the described embodiment is useful for applications were throughput or low clock rate are important.

The encoding process described with reference to FIG. 3 may be performed for both the natural order and interleaved encoding steps that make up the standard Turbo Code encoder. For the interleaved encoding the steps are the same, but the process of reading out the data without memory access conflict or clashes may become an issue. Various circuit architectures for handling the reading and writing of the data frame and resulting parity bits are discussed below.

In an alternative embodiment of the invention the determination of the tail bit termination initiation state may be performed serially as the data is loaded into a memory buffer. That is, the information bits (or bit pairs or other symbols) may be passed through a zero initialized encoder as they are written into a memory buffer. The final state of the encoder is then used to determine the tail bite termination initialization state.

The memory buffer is typically used to read the data out in natural order during the second encoding during which actual parity bits are generated and for reading out in interleaved order both for the calculation of the tail bite termination initialization state.

In still another embodiment, the data may be passed through another encoder as it is written into the memory buffer. This second encoder will have its internal state reset to zero after each subsection is received thus calculating the delta zero for each subsection as the data is loaded into the memory buffer. Once this is done the process of row (A), for the natural sequence encoding, can be eliminated as it was performed during the loading of the frame.

In another embodiment of the invention a zero terminated Turbo Code encoder may be used. FIG. 2A provides and example of a zero terminated Turbo Code encoder, the use of which is well known in the art. The zero terminated Turbo Code encoder only requires one pass of the data frame for the natural and interleaved encoding steps. Zero termination is done at the expense of transmitting extra termination data and parity bits (overhead) that are associated with the zero termination of any of the constituent encoders of the Turbo Code encoder.

In an embodiment of the invention using zero termination the encoding can be performed in similar fashion to that of FIG. 3, except the steps associated with row (C) are not necessary as the tail bite termination initialization state is not calculated. Additionally, the calculation of the final state ($F_{1,3}$) of last subsection (subsection 3) is not necessary in some embodiments as the final state is predetermined to be zero by virtue of the termination. Similarly, the calculation of the delta zero value for the final subsection (subsection 3) is also not necessary since no look-ahead operation will be required for that subsection.

Also, the second encoding of the first subsection (subsection 0) performed in row (D) is not necessary as the first encoding of subsection 0 performed in row (A) confirms with the actual encoding of the frame. That is, the encoding performed during step (A) starts with a zero initialized encoder which is consistent with the actual encoding of the data frame. Thus, parity bits can be generated during step (A) for the encoding of the first subsection (subsection 0).

Therefore, for the processing of the subsections performed in steps (A) and (D) only three subsection (or $N_{ss}$–1 where $N_{ss}$ is the number of subsections) are processed thus eliminated the need for one encoder circuit. Additionally, one less state change table look-up is performed thus eliminating one such step or circuit.

Figure 4:
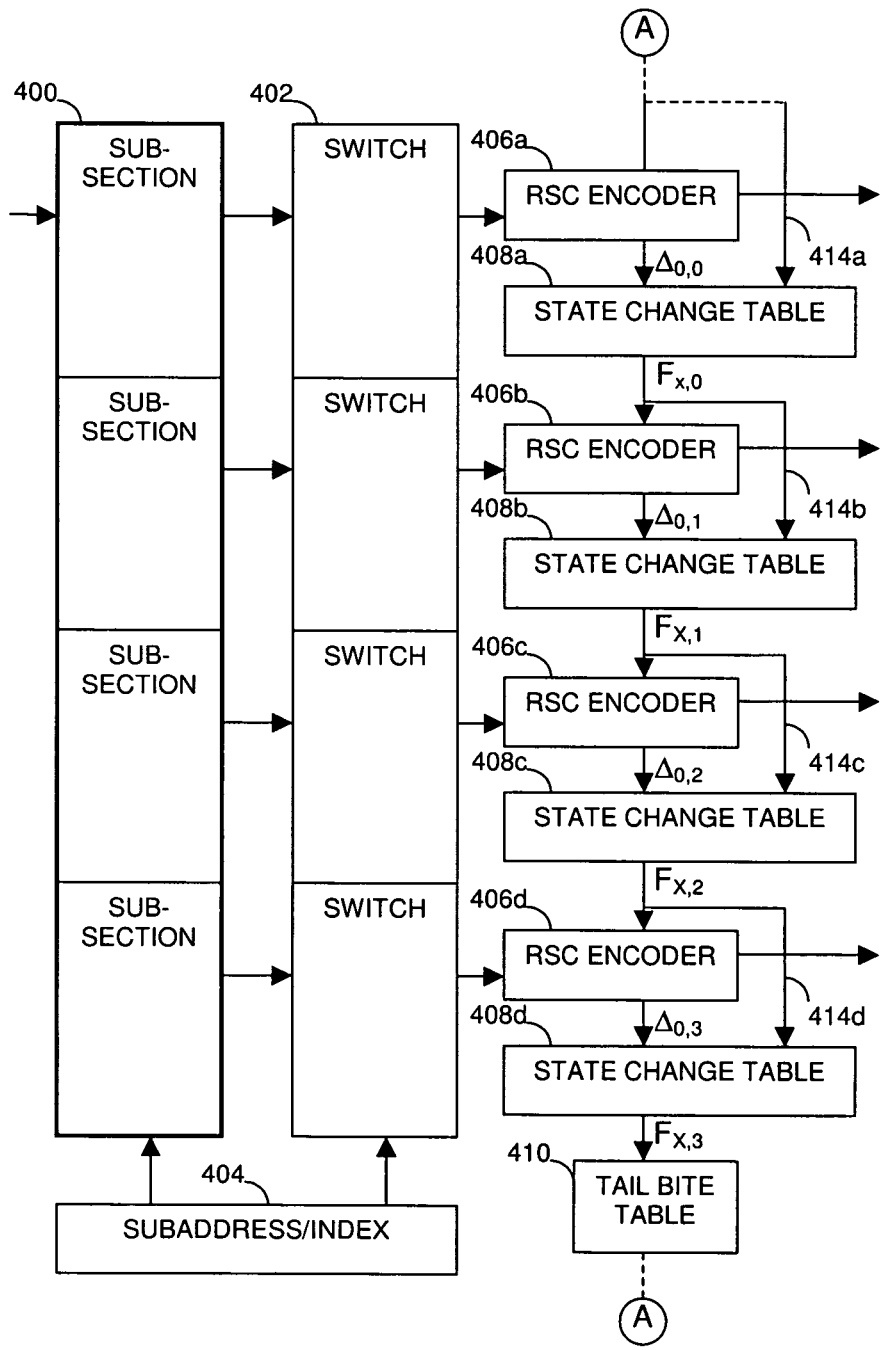
FIG. 4 is a block diagram of an encoder configured in accordance with some embodiments of the invention.

FIG. 4 is a block diagram of an encoder configured in accordance with some embodiments of the invention. The data frame to be encoded is stored in memory 400. Preferably, memory 400 is configured as four subsections each containing a portion of the data frame. Example configurations include having subsection be just part of one memory bank (each part of the single "word" read/written to the memory) or stored in separate memory banks. One memory bank is typically preferred as it will require less area and power than multiple banks, however, the ability to use a single memory bank can depend on the pseudo-random interleaver used in the Turbo Code.

In the described embodiment the addresses are stored in natural order in each subsection. For example, for a data frame containing 360 bits (indexed from 0 to 359) the first subsection will contain bits 0-89. The second subsection will contain bits 90-179. The third subsection with contain bits 180-269 and the fourth subsection will contain bits 270-359. The use of other storage arrangements is consistent with others embodiments of the invention, however, the described embodiment provides advantages that will be demonstrated below.

During encoding address/index circuit 404 generates addresses and indexes that are applied to memory 400 and switch circuit 402. During the non-interleaved encoding step switch 402 is typically configured as a simple pass through circuit and the addresses applied to memory 400 are just a set of natural order addresses. That is, for address 0 bits 0, 90, 180 and 270 of the frame are read out from memory 400 and for address 1 bits 1, 91, 181 and 271 are read out and so on up to address 89. In a preferred embodiment these data values are read out within a single word from the memory.

The data is passed through switches 402 and received by RSC encoders 406a-d. During an exemplary encoding in which tail bite termination is performed, each RSC encoder initializes its internal state to zero and then encodes the subsection of bits received via switches 402. The final state of the encoder is then recorded as delta zero factors $\Delta_{0,0}$-$\Delta_{0,3}$ which are then provided to state change tables 408a-d. The recording of the delta zero factors may occur in a register, latch or other memory circuit.

The new final states are calculated preferably in cascaded order beginning with state change table 408a. The same state change table 408 may be used in a time shared fashion with each RSC encoder 406 in some embodiments of the invention.

During the cascaded calculation of the new final state, the state change tables receive the delta factors $\Delta_{0,0}$-$\Delta_{0,3}$ as well as the start states 414a-d and calculate the final state $F_{x,0}$-$F_{x,3}$ for the corresponding RSC encoders 406. The start states for a particular encoder generally are the new final states of the previous (adjacent) RSC encoder, except for the first encoder 406a, where the start state is zero (0) for the tail bite calculation pass or the calculated tail bite state (A) for the second pass (parity generation pass).

During the first pass (tail bite calculation pass) the final state of RSC encoder 406a is equal to the delta zero ($\Delta_{0,0}$). This is because RSC encoder 406a is by definition initiated with the zero state for the tail bite calculation pass. Thus the use of the state change table 408a can be bypassed for the first pass of the first RSC encoder 406a in some embodiments of the invention.

Once the final state ($F_{x,0}$) is known it is applied to state change table 408b as the start state 414b. State change table 408b also receives the delta zero value ($\Delta_{0,1}$) from RSC encoder 406b.

Using this init state 414b and delta zero value ($\Delta_{0,1}$) state table 408b calculates the final state ($F_{x,1}$) of RSC encoder 406b for the new init state. Final state ($F_{x,1}$) is applied to state change table 408c as signal 414c.

Using the init state 414c and delta zero value ($\Delta_{0,2}$) state table 408c calculates the final state ($F_{x,2}$) of RSC encoder 406c for the new init state. Final state ($F_{x,2}$) is applied to state change table 408d as signal 414d.

Using this init state 414d and delta zero value ($\Delta_{0,3}$) state table 408d calculates the final state ($F_{x,3}$) of RSC encoder 406d used for the new init state. Final state ($F_{x,3}$) is applied to tail bite table 410 which calculates the new tail bite termination state (A) which is then used to initialize RSC encoder 406a for the second encoding pass during which the actual parity bits are generated.

The generation of tail bite termination state is well known in the art and examples are available in standards such as IEEE 802.16d, 802.16e, ETSI DVB-RCS and HomePlug A/V.

By encoding portions of the frame in parallel using RSC encoders 406a-d, and then using the resulting delta zero values ($\Delta_{0,0}$-$\Delta_{0,3}$) and state change tables 408a-d to calculate new final states for each RSC encoders 406a-d, the tail bite termination state can be calculated in slightly more than one forth (¼) the number of clocks required when a single RSC encoder is used. The use of state change tables 408 facilitate this speed up because the recursive nature of the encoders does not normally allow encoding to begin at the intermediate points within the data frame. However, by observing the systematic relationship between the delta zero state and the true final state based on a different start state, the recursive nature of the RSC encoding can be overcome.

Once the tail bite termination state has been calculated it is applied to RSC encoder 406a for the second encoding of the data frame during which parity bits are generated. The parity bits are sent from RSC encoders 406a-d and then typically stored in a output buffer for further processing in the transmit chain along with the original data frame (the systematic bits). In some embodiments of the invention a second switch circuit (like switch 402) is used at the output to direct the parity bits to the proper location within the output buffer in converse fashion to the extraction of the data frame from subsection 400. However, typically the parity bits from the interleaved encoding are transmitted in interleaved order so this is not necessary.

During the second pass, the delta zero values ($\Delta_{0,0}$-$\Delta_{0,3}$) have already been calculated so the calculation of the init states for each RSC encoder 406 is performed before the processing of the data frame subsections. This process begins with the application of the tail bit termination state (A) as the init state of RSC encoder 406a.

The tail bite termination state (A) is also applied to state change table 408a along with delta zero value ($\Delta_{0,0}$) to calculate the projected final state ($F_{x,0}$) for RSC encoder 406a. Projected final state ($F_{x,0}$) is applied to RSC encoder 406b and state change table 408b. State change table 408b also receives delta zero value ($\Delta_{0,1}$) and calculates the final state ($F_{x,1}$) for RSC encoder 406b.

The final state ($F_{x,1}$) is applied to RSC encoder 406c and state change table 408c. RSC encoder 406c begins encoding of its segment and generating the associated parity bits or symbols. State change table 408c receives delta zero value ($\Delta_{0,2}$) and final state 414c and calculates the final state ($F_{x,2}$) which is applied to RSC encoder 406d. In the described embodiment, state change table 408d is not used during the second encoding pass as there is no need to generate a new tail bite termination state.

The set of RSC encoders 406 then perform encoding of their respective segments substantially in parallel using the new start states. During this encoding parity bits are generated for use in the downstream transmit processing.

The interleaved encoding pass progresses in similar fashion to the natural order encoding. The interleaved encoding is preferably performed on subsections of the interleaved data frame.

The interleaved encoding pass may be performed at a different time from the natural order encoding, or may be performed in parallel using another set of hardware or various blends of parallel/serial hardware clocking configurations, apparent to those skilled in the art. If performed in parallel, a second memory buffer 400 may be used or a dual port memory buffer 400 may also be used.

During the interleaved parallel encoding address/index 404 circuit controls the operation of memory 400 and switch 402 by generating the interleaved addresses (subaddresses) and index values that are applied thereto. The subaddresses and index values are generated based on the interleaver addresses for that subsection used in the pseudo random interleavers.

In a first embodiment a "conflict free" or "clash free" interleaver is used where the subaddress for each value is calculated as the address modulo the length of the subsection, where each subsection is of equal length. The length of the subsection is the number of information bits contained therein. The index is preferably calculated as the address divided by the length of the subsection but the assignment of which subsection to each RSC encoder is interleaver dependent.

For certain well designed interleavers this will allow all the subsections to be read (and written) using the same subaddress and each switch will route a portion of the resulting word to a unique RSC encoder, in some instances also using a single index value. The use of a single subaddress is preferred because it allows the subsections to be stored in parallel within a single memory thus saving circuit area and power consumption relative to separate memory blocks for each subsection. In this way the entire interleaver is generated by generating only a subsection of associated subaddress and a corresponding set of index values.

An example of an interleaver designed in a manner to allow such operation is the Turbo Code interleaver specified in the 3GPP-LTE standard (3GPP TS 36.212 v1.4.1 "$3^{rd}$ Generation Partnership Project; Technical Specification Group Radio Access Network; Evolved Universal Terrestrial Radio Access (E-UTRA); Multiplexing and channel coding) incorporated herein by reference. The interleaver specified in the HomePlug A/V standard also has this property.

The use of other interleavers is also consistent with the use of some embodiments of the invention, including interleavers where the subsection subaddresses are different for each subsection and/or the index value is different for each subsection. In this case multiple subaddress or index generation circuits, or both, may be required.

Also, those skilled in the art will recognize various alternative arrangements to store values in the subsections as well as various mathematical transforms and representations that produce similar properties of non-conflicted addresses of the information bits in the subsection. For example, contribution R1-063265 to 3GPP TSG RAN WG1 (incorporated herein by reference) describes a method for parallelizing the 3GPP Release 6 Turbo Code interleaver in the context of Turbo Code decoding. This, or similar, parallelization schemes could be incorporated in the context of the encoding described herein for some embodiments of the invention.

Parallelization may also use different subsection lengths. In general, the use of various other interleaver parallelization schemes are consistent with some embodiments of the invention. Also, non-parallelized interleaver schemes may be used where certain encoders are stalled or multiple copies of the data frame are stored for simultaneous access in still other embodiments of the invention.

During the interleaved encoding pass the tail bite termination state is calculated in similar fashion to the natural order encoding except the address and index values associated with the interleaver are applied to memory 400 and switch 402. During the first read each RSC encoder 406 first calculates the corresponding delta zero values $\Delta_{0,0}$-$\Delta_{0,3}$. The delta zero values ($\Delta_{0,0}$-$\Delta_{0,3}$) are then applied in serial fashion to state change tables 408 along with new init states 414 to calculate the look-ahead final states $F_{x,0}$-$F_{x,3}$, with each look-ahead final state being used after its calculation as the init state for the next state change table 408.

The final look-ahead state is then applied to tail bite table 410 to calculate the tail bite initialization state (A). A second set of look-ahead calculations are performed to calculate the start state for each RSC encoder 406 based on the new initialization state (A). Once the new set of initialization states have been calculated, the subsection data bits are read out once again using the interleaver derived subaddress and index values. During this second reading the parity bits are generated by each RSC encoder 406. In one embodiment of the invention the resulting parity bits are passed through a second switch circuit into an output buffer memory (not shown) where the second switch circuit and output buffer are controlled by another subaddress/index generation circuit (also not shown).

As noted above the interleaved encoding may be performed using the same circuitry as that used during the natural order encoding or a second set of circuitry may be used, or some blend thereof.

Tables 2a-2f provide example entries for the state change tables when configured in accordance with one embodiment of the invention. In this embodiment a duo-binary RSC encoder like that of FIG. 2B may be used.

TABLE 2a

State Change Table for (N mod 7 = 1)

| Delta 0 | New State | | | | | | | |
|---|---|---|---|---|---|---|---|---|
| | 0 | 1 | 2 | 3 | 4 | 5 | 6 | 7 |
| 0 | 0 | 5 | 1 | 4 | 2 | 7 | 3 | 6 |
| 1 | 1 | 4 | 0 | 5 | 3 | 6 | 2 | 7 |
| 2 | 2 | 7 | 3 | 6 | 0 | 5 | 1 | 4 |
| 3 | 3 | 6 | 2 | 7 | 1 | 4 | 0 | 5 |
| 4 | 4 | 1 | 5 | 0 | 6 | 3 | 7 | 2 |
| 5 | 5 | 0 | 4 | 1 | 7 | 2 | 6 | 3 |
| 6 | 6 | 3 | 7 | 2 | 4 | 1 | 5 | 0 |
| 7 | 7 | 2 | 6 | 3 | 5 | 0 | 4 | 1 |

TABLE 2b

State Change Table for (N mod 7 = 2)

| Delta 0 | New State | | | | | | | |
|---|---|---|---|---|---|---|---|---|
| | 0 | 1 | 2 | 3 | 4 | 5 | 6 | 7 |
| 0 | 0 | 7 | 5 | 2 | 1 | 6 | 4 | 3 |
| 1 | 1 | 6 | 5 | 3 | 0 | 7 | 5 | 2 |
| 2 | 2 | 5 | 7 | 0 | 3 | 4 | 6 | 1 |
| 3 | 3 | 4 | 6 | 1 | 2 | 5 | 7 | 0 |
| 4 | 4 | 3 | 1 | 6 | 5 | 2 | 0 | 7 |
| 5 | 5 | 2 | 0 | 7 | 4 | 3 | 1 | 6 |
| 6 | 6 | 1 | 3 | 4 | 7 | 0 | 2 | 5 |
| 7 | 7 | 0 | 2 | 5 | 6 | 1 | 3 | 4 |

TABLE 2c

State Change Table for (N mod 7 = 3)

| Delta 0/ | New State | | | | | | | |
|---|---|---|---|---|---|---|---|---|
| | 0 | 1 | 2 | 3 | 4 | 5 | 6 | 7 |
| 0 | 0 | 6 | 7 | 1 | 5 | 3 | 2 | 4 |
| 1 | 1 | 7 | 6 | 0 | 4 | 2 | 3 | 5 |
| 2 | 2 | 4 | 5 | 3 | 7 | 1 | 0 | 6 |

TABLE 2c-continued

State Change Table for (N mod 7 = 3)

| Delta 0/ | New State | | | | | | | |
|---|---|---|---|---|---|---|---|---|
| | 0 | 1 | 2 | 3 | 4 | 5 | 6 | 7 |
| 3 | 3 | 5 | 4 | 2 | 6 | 0 | 1 | 7 |
| 4 | 4 | 2 | 3 | 5 | 1 | 7 | 6 | 0 |
| 5 | 5 | 3 | 2 | 4 | 0 | 6 | 7 | 1 |
| 6 | 6 | 0 | 1 | 7 | 3 | 5 | 4 | 2 |
| 7 | 7 | 1 | 0 | 6 | 2 | 4 | 5 | 3 |

TABLE 2d

State Change Table for (N mod 7 = 4)

| Delta 0/ | New State | | | | | | | |
|---|---|---|---|---|---|---|---|---|
| | 0 | 1 | 2 | 3 | 4 | 5 | 6 | 7 |
| 0 | 0 | 3 | 6 | 5 | 7 | 4 | 1 | 2 |
| 1 | 1 | 2 | 7 | 4 | 6 | 5 | 0 | 3 |
| 2 | 2 | 1 | 4 | 7 | 5 | 6 | 3 | 0 |
| 3 | 3 | 0 | 5 | 6 | 4 | 7 | 2 | 1 |
| 4 | 4 | 7 | 2 | 1 | 3 | 0 | 5 | 6 |
| 5 | 5 | 6 | 3 | 0 | 2 | 1 | 4 | 7 |
| 6 | 6 | 5 | 0 | 3 | 1 | 2 | 7 | 4 |
| 7 | 7 | 4 | 2 | 1 | 0 | 3 | 6 | 5 |

TABLE 2e

State Change Table for (N mod 7 = 5)

| Delta 0 | New State | | | | | | | |
|---|---|---|---|---|---|---|---|---|
| | 0 | 1 | 2 | 3 | 4 | 5 | 6 | 7 |
| 0 | 0 | 4 | 3 | 7 | 6 | 2 | 5 | 1 |
| 1 | 1 | 5 | 2 | 6 | 7 | 3 | 4 | 0 |
| 2 | 2 | 6 | 1 | 5 | 4 | 0 | 7 | 3 |
| 3 | 3 | 7 | 0 | 4 | 5 | 1 | 6 | 2 |
| 4 | 4 | 0 | 7 | 3 | 2 | 6 | 1 | 5 |
| 5 | 5 | 1 | 6 | 2 | 3 | 7 | 0 | 4 |
| 6 | 6 | 2 | 5 | 1 | 0 | 4 | 3 | 7 |
| 7 | 7 | 3 | 4 | 0 | 1 | 5 | 2 | 6 |

TABLE 2f

State Change Table for (N mod 7 = 6)

| Delta 0 | New State | | | | | | | |
|---|---|---|---|---|---|---|---|---|
| | 0 | 1 | 2 | 3 | 4 | 5 | 6 | 7 |
| 0 | 0 | 2 | 4 | 6 | 3 | 1 | 7 | 5 |
| 1 | 1 | 3 | 5 | 7 | 2 | 0 | 6 | 4 |
| 2 | 2 | 0 | 6 | 4 | 1 | 3 | 5 | 7 |
| 3 | 3 | 1 | 7 | 5 | 0 | 2 | 4 | 6 |
| 4 | 4 | 6 | 0 | 2 | 7 | 5 | 3 | 1 |
| 5 | 5 | 7 | 1 | 3 | 6 | 4 | 2 | 0 |
| 6 | 6 | 4 | 2 | 0 | 5 | 7 | 1 | 3 |
| 7 | 7 | 5 | 3 | 1 | 4 | 6 | 0 | 2 |

The rows correspond to the delta 0 value calculated for the subsection and the columns correspond to the new initialization state for the encoder. The entry for that row-column combination is the predicted look-ahead final state of that subsection given the particular delta 0 and new initialization state. The different Tables 2a-f corresponds to the mod 7 value of the subsection length (N).

The values for the state change table for a particular encoder may be determined in various ways. A relatively easy way is a computer performed search. In the search random data is passed through a zero initialized constituent encoder and the final state of the encoder is recorded (the delta 0 state). Then the encoder is initialized to all the other possible states (1-7) and the same data is encoded and the final state recorded for each encoding. This represents the row entry for that particular delta zero value. This can be repeated for different frame (or subsection) lengths to create a complete state change table or as many entries as it sufficient for the desired application. Those skilled in the art will recognize various other methods for creating and/or implementing the state change table including Boolean algebraic methods and implementations.

While the use of a delta value based on the state change expired by an encoder is a preferred method of characterizing the data contained in the subsection, other data dependent metrics can be employed in alternative embodiments of the invention including metrics based on the weight of the codeword represented by the subsection. The data contained in the subsection could also be characterized by other circuits that are not identical to the encoder but which perform a characterization that could be used to predict, for example, the state change an encoder would experience if such data were applied.

A key aspect of some embodiments of the invention is simply the substantially parallel (or simultaneous) preanalysis of the data contained in various subsections and subsequent use of that preanalysis to allow a parallel (simultaneous) encoding of those subsections to be performed. In some embodiments of the invention, the preanalysis allows the true start state of the encoders to be known and therefore parallel encoding to be conducted. The use of the delta value as described herein is highly convenient, however, as the same hardware used for the preanalysis and the actual encoding.

The encoding described with reference to FIG. 4 may also be performed for a zero terminated Turbo Code with operations of RSC encoder and the state look up table(s) being modified in accordance with the changes described above with reference to FIG. 3.

Other embodiments of the invention include those listed below.

B.1 An apparatus for Turbo code encoding a frame of data comprising:
 memory unit for storing said frame of data and for reading segments of said frame out in parallel;
 a plurality of encoder circuits for receiving a set of segments of said frame and for calculation of a set of state deltas based on a set of start state and a set of end state based on said encoding of said set of segment;
 a new state table for calculating a set of new end states based on said set of state deltas and a set of new start states, wherein
 said plurality of encoders a further for generating parity bits in parallel based on said set of new start states.

C.1 A method for Turbo Code encoding a frame of data, said Turbo Code encoding using a pseudo-random interleaver, and said data frame including a first subsection and a second subsection, said encoding comprising the steps of:
 encoding said first subsection and said second subsection substantially in parallel;
 recording a first end state for said first subsection;
 recording a delta value for said second subsection;
 predicting a true final state for said second subsection using said delta value and said first end state.

C.2 The method as set forth in claim C.1 further comprising the step of:
 setting a start state for a third subsection to said true final state.

C.3 The method as set forth in claim C.1 further comprising the step of:
 calculating a tail bite start state using said true final state.

C.4 The method a set forth in claim C.1 wherein said predicting step is performed by applying said delta value and said first end state to a table of predicted final states.

C.5 The method as set forth in claim C.1 wherein said data frame is also comprised of a first interleaved subsection and a second interleaved subsection, and further comprising the steps of:
 reading said first interleaved subsection and said second interleaved subsection substantially in parallel.
 encoding said first interleaved subsection and said second interleaved subsection substantially in parallel;
 recording a first end state for said first interleaved subsection;
 recording a delta value for said second interleaved subsection;
 predicting a true final state for said second interleaved subsection using said delta value and said first end state.

C.6 The method as set forth in claim C.5 wherein said reading step is performed using the steps:
 generating a subaddress value for reading a first data value from said first interleaved subsection and a second data value from said second interleaved subsection; and
 generating an index value for routing said first data value and said data value;

D.1 A Turbo Code encoder for encoding a data frame comprising:
 first constituent encoder
 second constituent encoder;
 state change table;
 memory for storing said data frame and reading multiple data values out in parallel, wherein
 said first constituent encoder generates a final state by encoding a first natural order subsection of said data frame,
 said second constituent encoder generates a delta value by encoding a second natural order subsection of said data frame,
 said state change table generates a new final state for said second natural order subsection based on said delta value and said final state.

D.2 The Turbo Code encoder as set forth in claim D.1 where in said final state is the start state for the second constituent encoder.

D.3 The Turbo Code encoder as set forth in claim D.1 wherein said second constituent encoder encodes said second natural order subsection a second time using said final state as a start state.

D.4 The Turbo Code encoder as set forth in claim D.3 where said second constituent encoder generates parity symbols during said second encoding of said second natural order subsection.

D.5. The Turbo Code encoder as set forth in claim D.3 further comprising:
 third constituent encoder for encoding a third natural order subsection using said new final state as a start state.

E.1 A Turbo Code encoder circuit for encoding a data frame comprising:
 a state change prediction circuit for generating a new end state in response to a state change value and a new start state;

first constituent encoder for generating a final state by encoding a first subsection of said data frame;

second constituent encoder for generating a state change value by encoding a second subsection of said data frame, wherein said new start state is set to said final state.

F.1 A method for Turbo Code encoding a frame of data comprising the steps of:
- a) encoding a set of subsections of said frames to generate a set of delta values and a set of final states;
- b) calculating a set of new start states based on said set of delta values and set of final states
- c) reencoding at least a portion of said set of subsections using said set of new start states.

F.2 The method of claim F.1 wherein step b) is performed via the steps:
- b.1) calculating a first new end state for a first subsection using a first delta value for said first subsection and final state from a prior subsection;
- b.2) calculating a second new end state for a second subsection using a second delta value for said second subsection and said first new end state as a start state.

F.3 The method of claim F.2 wherein step b.1 and step b.2 are performed separately in time.

F.4 The method of claim F.1 wherein step b) is performed by applying said set of delta value and said set of final values to one or more lookup tables.

F.5 The method as set forth in claim F.1 further comprising the steps of:
encoding a second set of subsections, where said second set of subsections are taken from an interleaved version of said data frame.

G.1 A method for Turbo Code encoding a frame of data comprising the steps of:
- a) calculating a set of delta state values for a set of natural order subsections;
- b) calculating a set of end states for said set of natural order subsections substantially in parallel;
- c) calculating a set of new end states for at least a portion of said natural order subsections using said delta state values and said final states;
- d) encoding at least a portion of said natural order subsections using said set of new end states as start states substantially in parallel.

G.2 The method as set forth in claim G.1 further comprising the step of:
calculating a tail bite termination state, using a final state from said set of final states;
encoding a natural order subsection from said set of natural order subsections using said tail bite termination state as an start state.

G.3 The method as set forth in claim G.3 further comprising the steps of:
calculating a set of delta state values for a set of interleaved order subsections substantially in parallel;
calculating a set of end states for said set of interleaved order subsections substantially in parallel;
calculating a second set of new end states for at least a portion of said interleaved order subsections using said delta state values and said final states;
calculating at least a portion of said interleaved order subsections using said second set of new end states as start states.

G.4 The method as set forth in claim G.1 further comprising the steps of:
reading out said natural order subsections substantially in parallel.

G.5 The method as set forth in claim G.3 further comprising the steps of:
reading out said interleaved order subsections substantially in parallel.

H.1 A Turbo Code encoder for encoding a frame of data comprising:
plurality of constituent encoders for receiving subsections of said data frame and generating delta values and first final states;
state change table for calculating new final states based on said delta values and said first final states, wherein:
said plurality of constituent encoder are further for receiving said subsection of said data frame a second time and using said new final states as start states encoding said subsections and generating parity bits.

H.2 The Turbo Code encoder as set forth in Claim H.1 wherein said subsections are natural order subsections.

H.3 The Turbo Code encoder as set forth in Claim H.1 wherein said subsections are interleaved order subsections.

H.4 The Turbo Code encoder as set forth in Claim H.1 further comprising:
memory for reading out said subsection in parallel;
switch for routing said subsections to plurality of constituent encoders.

H.5 The Turbo Code encoder as set forth in Claim further comprising:
Address generation circuit for generating a set of addresses for reading out said subsections;
index generation circuit for generating a set of index value for controlling said switch.

H.6 The Turbo Code encoder as set forth in claim H.1 wherein said plurality of constituent encoders are comprised of encoders consistent with the encoding performed by encoder of FIG. 2A.

H.6 The Turbo Code encoder as set forth in claim H.1 wherein said plurality of constituent encoders are comprised of encoders consistent with the encoding performed by encoder of FIG. 2B.

H.7 The Turbo Code encoder as set forth in claim H.6 wherein said state change table includes at least one entry from tables 2a-f above and said delta value is calculated using a start state of zero.

H.8 The Turbo Code encoder as set forth in claim H.5 wherein said subaddress is a pseudo-random interleaver address modulo a subsection length and said index is said pseudo-random interleaver address divided by said subsection length.

K.1 A method for encoding a data frame comprising the steps of:
performing a pre-analysis on a first subsection from said data frame;
determining a true final state of said first subsection based on said pre-analysis and a new start state;
using said true final state as a start state for a second subsection from data frame.

Thus, a method and apparatus for performing low latency Turbo Code encoding of a frame of data has been described. While the invention is described in the context or one or more exemplary embodiments, those skilled in the art will recognize various alternative implementations of the invention. The exemplary embodiment provided herein should not be viewed as limiting the scope of the invention set forth more clearly in the following claims. Additionally, while various details of the implementation are believed to be accurate at the time of this disclosure, including tables provided herein, any error in such disclose will not prevent one skilled in the art from implementing the invention and correction of any such errors through simple testing and analysis thereof.

The invention claimed is:

1. A method for Turbo code encoding a data frame using a turbo encoder device, said data frame having a subsection 0, a subsection 1 and a subsection 2 which are adjacent to one another, said turbo code using a pseudo-random interleaver, said method comprising the steps of:
   a) encoding said subsection 0 using a first start state and recording a first end state
   b) encoding said subsection 1 using a second state and recording a second end state;
   c) encoding said subsection 1 using a second state and recording a second end state;
   d) calculating a first new end state for said subsection 1 using said first end state and said second end state;
   e) encoding subsection 2 using said first new end state as a new start state and generating parity bits thereby, wherein
   steps a), b) and c) are performed substantially in parallel.

2. The method as set forth in claim 1 wherein subsection 0, subsection 1 and subsection 2 are subsections of an interleaved version of said data frame.

3. The method as set forth in claim 2 wherein said data frame further comprises a last subsection, and said method further comprises the steps of:
   1) calculating a tail bite termination init state using an end state from said last subsection;
   2) calculating a new end state for said subsection 0 using said tail bite termination init state and a delta value;
   3) encoding said subsection 0 using said tail bite termination init state and generating parity bits thereby;
   4) encoding said subsection 1 using said new end state and generating parity bits thereby, wherein
   Steps 3) and 4) are performed substantially in parallel.

4. The method of claim 2 further comprising the steps of:
   Reading out said subsections substantially in parallel based on a set of subaddresses calculated from said pseudo-random interleaver;
   routing said subsections to a set of encoders using indexes calculated from said pseudo random interleaver.

5. A circuit for performing Turbo Code encoding of a data frame, said data frame having a subsection, said circuit comprising:
   encoder for performing a first encoding on said subsection and generating a data dependant value based on the data contained in said subsection;
   state change circuit for predicting a new end state for said subsection based on a new start state and said data dependant value.

6. The circuit as set forth in claim 5 wherein said data dependant value is a value generated based on a difference between a first start state and a first end state generating during said first encoding.

7. The circuit as set forth in claim 6 wherein said encoder is further for performing a second encoding on said subsection after receiving a first new start state.

8. The circuit as set forth in claim 6 wherein said encoder generates parity bits during said second encoding.

9. The circuit as set forth in claim 5 further comprising:
   second encoder for performing a second encoding on a second subsection of said data frame using said new end state as a start state.

10. The circuit as set forth in claim 5 further comprising:
    second encoder for performing a second encoding on a second subsection of said data frame using said new end state as a start state, and wherein said first encoding is further for performing a second encoding on said subsection after receiving a first new start state, wherein said second encoding on said second subsection and said second encoding on said subsection are performed substantially at the same time.

* * * * *